US012792574B2

(12) United States Patent
Johari et al.

(10) Patent No.: US 12,792,574 B2
(45) Date of Patent: Nov. 10, 2026

(54) FEATURE FLAG PAYLOAD COMPRESSION USING DICTIONARIES

(71) Applicant: Roblox Corporation, San Mateo, CA (US)

(72) Inventors: Neil Johari, San Mateo, CA (US); Benjamin Vinson, Broomfield, CO (US)

(73) Assignee: Roblox Corporation, San Mateo, CA (US)

( * ) Notice: Subject to any disclaimer, the term of this patent is extended or adjusted under 35 U.S.C. 154(b) by 0 days.

(21) Appl. No.: 19/169,582

(22) Filed: Apr. 3, 2025

(65) Prior Publication Data

US 2026/0310635 A1 Oct. 8, 2026

(51) Int. Cl.

| | |
|---|---|
| ***G06F 16/21*** | (2019.01) |
| ***G06F 16/22*** | (2019.01) |
| ***H03M 7/30*** | (2006.01) |

(52) U.S. Cl.

CPC ........ *G06F 16/212* (2019.01); *G06F 16/2255* (2019.01); *H03M 7/3088* (2013.01)

(58) Field of Classification Search

CPC .. G06F 16/212; G06F 16/2255; G06F 16/325; G06F 16/9014; H04L 69/04; H03M 7/3088

See application file for complete search history.

(56) References Cited

U.S. PATENT DOCUMENTS

| | | | | |
|---|---|---|---|---|
| 9,973,597 | B1 * | 5/2018 | Karppanen | H04L 69/04 |
| 2008/0281984 | A1 * | 11/2008 | Roberts | H03M 7/30 709/247 |
| 2009/0024763 | A1 * | 1/2009 | Stepin | H04L 63/0428 709/247 |
| 2011/0145313 | A1 * | 6/2011 | Narayanan | H04L 69/04 709/203 |
| 2013/0114626 | A1 * | 5/2013 | Bellessort | H03M 7/3088 370/477 |
| 2021/0406073 | A1 * | 12/2021 | Pavlov | G06F 16/2365 |
| 2025/0077610 | A1 * | 3/2025 | Unal | G06F 16/9577 |

* cited by examiner

*Primary Examiner* — James E Richardson

(74) *Attorney, Agent, or Firm* — IP Spring

(57) ABSTRACT

Various implementations relate to methods, systems, and computer-readable media for compressing feature flag payloads using shared compression dictionaries. According to one aspect, a computer-implemented method includes receiving, at a server, a request for a feature flag payload from a client device, the request indicating a version of a compression dictionary stored on the client device. A current set of feature flags applicable to the client device are retrieved based on a platform type corresponding to the client device, and a determination is made of whether the version of the compression dictionary is current. In response to the determination, the feature flag payload using the version of the compression dictionary is compressed. The feature flag payload is then transmitted to the client device.

20 Claims, 5 Drawing Sheets

300

"FFlagGamepadMessageKey": "True",
"DFFlagBatch23HotrodMigration": "True",
"DFFlagBatch25HotrodMigration": "True",
"FFlagPSControllerDisconnect": "True",
"DFFlagBetterErrorMessages": "True",
"FFlagDisableFeedbackSoothsayerCheck": "True",
"FFlagDisableChromeFollowupFTUX": "True",
"FFlagEnableAppCommonInputHooks": "True",
"FFlagEnableVRInputModeHandling": "True",
"AndroidAppChatMigrationEnabled": "true",
"FFlagSocialContextToastEventStream3": "True",
"FFlagVideoFixGpuShaderAspectRatio2": "True",
"FFlagFixWindowAverageUnderflow": "True",
"FIntAIDiffPromptLengthCharLimits": "3145728",
"DFIntNetworkStreamingGCMaxMicroSecondLimitPartsModels": "5000",
"DFIntNetworkStreamingGCUrgentMaxMicroSecondLimitPartsModels": "100000",
"DFFlagOnlyAllowThumbnailRbxCdnUrls2": "True",
"FFlagLuaAppInlineRequireAppConfigurer": "False",
"FFlagRefactorHomePageUpsellCardWithIconToFunctional": "True",
"FFlagDecomposeDesktopCapturesEligibilityCheck": "True",
"FFlagToolboxSampleProductMUS4182": "False",
"FFlagRefactorOmniSearchFetch": "True",

FIG. 3A

350

FFlagGamepadMessageKey":"True","DFFlagBatch23HotrodMigration":"True","DFFlagBatch2
5HotrodMigration":"True","FFlagPSControllerDisconnect":"True","DFFlagBetterErrorMessag
es":"True","FFlagDisableFeedbackSoothsayerCheck":"True","FFlagDisableChromeFollowup
FTUX":"True","FFlagEnableAppCommonInputHooks":"True","FFlagEnableVRInputModeHan
dling":"True","AndroidAppChatMigrationEnabled":"true","FFlagSocialContextToastEventStre
am3":"True","FFlagVideoFixGpuShaderAspectRatio2":"True","FFlagFixWindowAverageUnder
flow":"True","FIntAIDiffPromptLengthCharLimits":"3145728","DFIntNetworkStreamingGCM
axMicroSecondLimitPartsModels":"5000","DFIntNetworkStreamingGCUrgentMaxMicroSec
ondLimitPartsModels":"100000","DFFlagOnlyAllowThumbnailRbxCdnUrls2":"True","FFlagLu
aAppInlineRequireAppConfigurer":"False","FFlagRefactorHomePageUpsellCardWithIconTo
Functional":"True","FFlagDecomposeDesktopCapturesEligibilityCheck":"True","FFlagToolbo
xSampleProductMUS4182":"True","FFlagRefactorOmniSearchFetch":"True",

FIG. 3B

FEATURE FLAG PAYLOAD COMPRESSION USING DICTIONARIES

TECHNICAL FIELD

Implementations relate generally to data compression in networked applications, and more specifically but not exclusively, relate to methods, systems, and computer-readable media to compress feature flag payloads using shared compression dictionaries.

BACKGROUND

Many modern applications rely on feature flags to dynamically enable or disable functionality without requiring users to update their application software (e.g., executable running locally on a client device). Feature flags enable developers to control the rollout of new features, conduct A/B testing, and provide customized experiences for different user segments. Feature flag payloads are transmitted from a server to client devices, where they are used to configure application behavior. To reduce bandwidth usage for feature flag package and to improve time-to-interactivity by applying the feature flag payloads, compression techniques can be employed to reduce the size of feature flag payloads.

Traditional approaches to compressing feature flag payloads rely on general-purpose compression algorithms. The techniques reduce redundant data within a given payload, but do not take advantage of structural similarities across multiple payloads. As a result, feature flag payloads, which include repetitive data across different clients or versions, may not achieve optimal compression ratios using the techniques, and thereby require substantial data bandwidth usage and have high time-to-interactivity. Furthermore, standard compression introduces computational overhead at both the server and client, increasing latency during application startup or feature retrieval.

Feature flag compression faces challenges in environments that use content delivery networks (CDNs) and other intermediary proxies. Standard compression negotiation mechanisms rely on HTTP headers such as Accept-Encoding to determine the appropriate encoding format. Intermediary proxies between a client device and a server may modify the headers or apply additional layers of compression, leading to unintended double compression or inconsistencies in payload delivery. Header-based negotiation does not always ensure consistent delivery of compressed payloads across diverse network infrastructures.

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Implementations described herein relate to methods, systems, and computer-readable media for compressing feature flag payloads using shared compression dictionaries.

According to one aspect, a computer-implemented method includes receiving, from a client device and at a server, a request for a feature flag payload, the request including an indication of a version of a compression dictionary stored on the client device. The computer-implemented method includes retrieving a current set of feature flags applicable to the client device based on a platform type corresponding to the client device. The computer-implemented method includes determining, based on the indication, whether the version of the compression dictionary is current. In response to determining that the version of the compression dictionary is current, the computer-implemented method includes compressing the retrieved current set of feature flags into the feature flag payload using the version of the compression dictionary. The computer-implemented method includes transmitting the feature flag payload to the client device.

In some implementations, in response to determining that the version of the compression dictionary is not current, the computer-implemented method includes compressing the retrieved current set of feature flags into the feature flag payload using a compression technique that does not use the compression dictionary.

In some implementations, the computer-implemented method includes the compression dictionary including a data structure generated by merging a current set of feature flags for multiple platform types.

In some implementations, the computer-implemented method includes computing a hash value of the compression dictionary, where the hash value uniquely identifies the compression dictionary, and the hash value is embedded into a client-accessible identifier.

In some implementations, the computer-implemented method includes, prior to compressing the retrieved current set of feature flags into the feature flag payload, determining that the compression dictionary is not available at the server, and in response, compressing the retrieved current set of feature flags into the feature flag payload using a compression technique that does not use the compression dictionary.

In some implementations, the computer-implemented method includes predicting a rate of degradation for the compression dictionary, and based on the rate of degradation, determining a time period for which the compression dictionary is effective.

In some implementations, the computer-implemented method includes determining that the version of the compression dictionary is not available at a pre-specified uniform resource locator (URL) path. Upon a determination that the version of the compression dictionary is not available at the pre-specified URL path, the client is redirected to a fallback endpoint that provides a feature flag payload compressed using a compression technique that does not use the compression dictionary.

In some implementations, the computer-implemented method includes embedding the compression dictionary into a binary of a client application, where the client application is available for download from the server.

In some implementations, the computer-implemented method includes generating the feature flag payload using a compression scheme that prevents modification by intermediary proxies along a network path between the client device and the server, sending the feature flag payload using a request format that specifies the version of the compression dictionary and restricts unsupported encoding modifications, where the request format directs the intermediary proxies to pass the feature flag payload from the server to the client device without modification.

According to another aspect, a system includes one or more processors and memory coupled to the one or more processors storing instructions that, when executed by the one or more processors, cause the one or more processors to perform operations including receiving, from a client device and at a server, a request for a feature flag payload, the request including an indication of a version of a compression dictionary stored on the client device. The operations further include retrieving a current set of feature flags applicable to the client device based on a platform type corresponding to the client device. The operations further include determining, based on the indication, whether the version of the compression dictionary is current. In response to determining that the version of the compression dictionary is current, the operations further include compressing the retrieved current set of feature flags into the feature flag payload using the version of the compression dictionary. The operations further include transmitting the feature flag payload to the client device.

In some implementations, the operations of the system further include, in response to determining that the version of the compression dictionary is not current, compressing the retrieved current set of feature flags into the feature flag payload using a compression technique that does not use the compression dictionary.

In some implementations, the operations of the system further include the compression dictionary including a data structure generated by merging a current set of feature flags for multiple platform types.

In some implementations, the operations of the system further include computing a hash value of the compression dictionary, where the hash value uniquely identifies the compression dictionary, and the hash value is embedded into a client-accessible identifier.

In some implementations, the operations of the system further include, prior to compressing the retrieved current set of feature flags into the feature flag payload, determining that the compression dictionary is not available at the server, and in response, compressing the retrieved current set of feature flags into the feature flag payload using a compression technique that does not use the compression dictionary.

In some implementations, the operations of the system further include predicting a rate of degradation for the compression dictionary, and based on the rate of degradation, determining a time period for which the compression dictionary is effective.

According to another aspect, a non-transitory computer-readable medium with instructions stored thereon is provided that, when executed by a processor, cause the processor to perform operations. The operations include receiving, from a client device and at a server, a request for a feature flag payload, the request including an indication of a version of a compression dictionary stored on the client device. The operations further include retrieving a current set of feature flags applicable to the client device based on a platform type corresponding to the client device. The operations further include determining, based on the indication, whether the version of the compression dictionary is current. In response to determining that the version of the compression dictionary is current, the operations further include compressing the retrieved current set of feature flags into the feature flag payload using the version of the compression dictionary. The operations further include transmitting the feature flag payload to the client device.

In some implementations, the operations of the non-transitory computer-readable medium further include, in response to determining that the version of the compression dictionary is not current, compressing the retrieved current set of feature flags into the feature flag payload using a compression technique that does not use the compression dictionary.

In some implementations, the operations of the non-transitory computer-readable medium further include the compression dictionary including a data structure generated by merging a current set of feature flags for multiple platform types.

In some implementations, the operations of the non-transitory computer-readable medium further include computing a hash value of the compression dictionary, where the hash value uniquely identifies the compression dictionary, and the hash value is embedded into a client-accessible identifier.

In some implementations, the operations of the non-transitory computer-readable medium further include, prior to compressing the retrieved current set of feature flags into the feature flag payload, determining that the compression dictionary is not available at the server, and in response, compressing the retrieved current set of feature flags into the feature flag payload using a compression technique that does not use the compression dictionary.

According to yet another aspect, portions, features, and implementation details of the systems, methods, and non-transitory computer-readable media may be combined to form additional aspects, including some aspects which omit and/or modify some or portions of individual components or features, include additional components or features, and/or other modifications, and all such modifications are within the scope of this disclosure.

BRIEF DESCRIPTION OF DRAWINGS

FIG. 3A is a screenshot illustrating an example of an excerpt from a feature flag payload, in accordance with some embodiments.

FIG. 3B is a screenshot illustrating an example of an excerpt from a compression dictionary created by merging payloads, in accordance with some embodiments.

DETAILED DESCRIPTION

Figure 1:
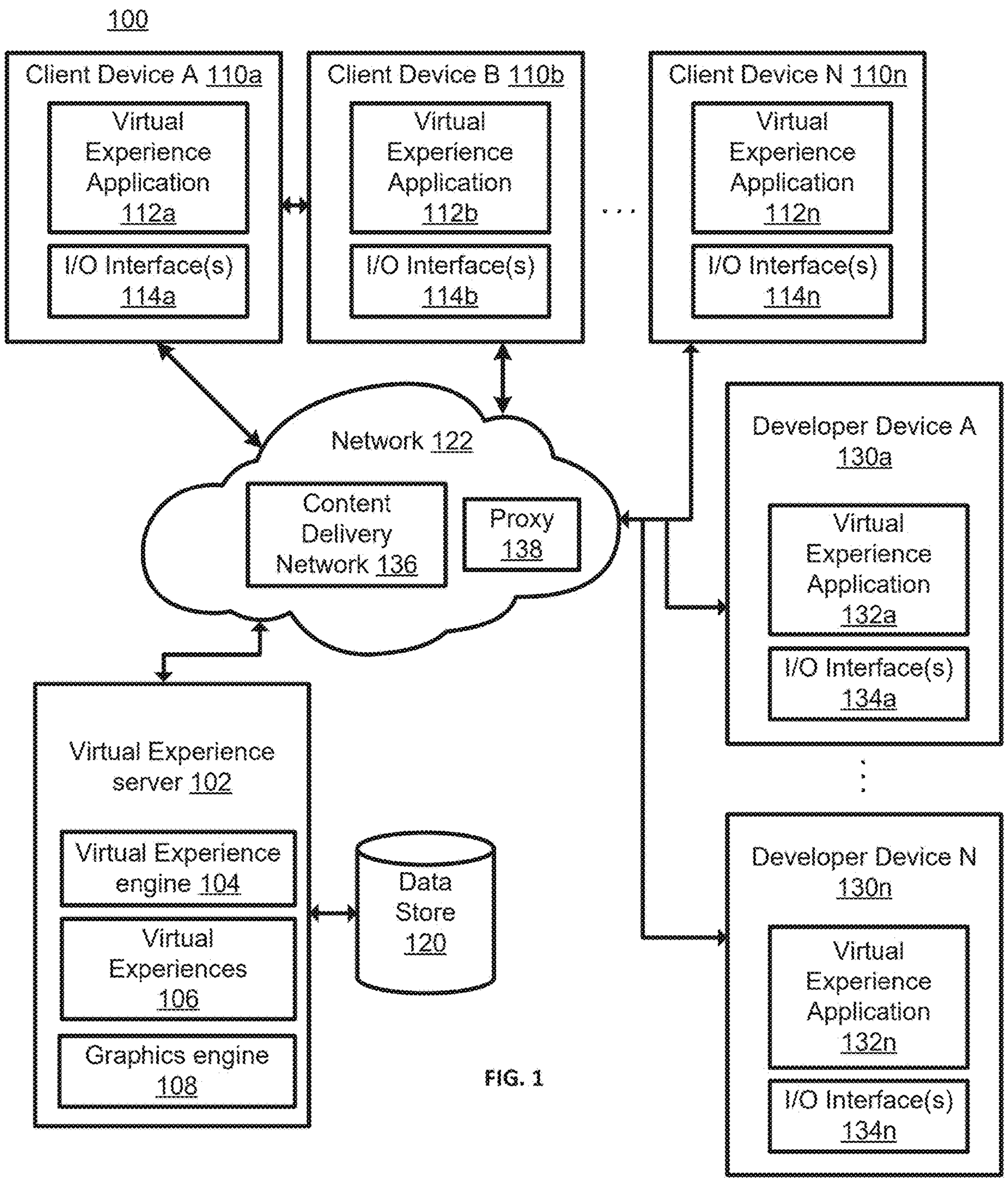
FIG. 1 is a diagram of an example system architecture, in accordance with some implementations.

In the following detailed description, reference is made to the accompanying drawings, which form a part hereof. In the drawings, similar symbols identify similar components, unless context dictates otherwise. The illustrative implementations described in the detailed description, drawings, and claims are not meant to be limiting. Other implementations may be utilized, and other changes may be made, without departing from the spirit or scope of the subject matter presented herein. Aspects of the present disclosure, as generally described herein, and illustrated in the Figures, can be arranged, substituted, combined, separated, and designed in a wide variety of different configurations, all of which are contemplated herein.

References in the specification to "some implementations", "an implementation", "an example implementation", etc. indicate that the implementation described may include a particular feature, structure, or characteristic, but every implementation may not necessarily include the particular feature, structure, or characteristic. Moreover, such phrases are not necessarily referring to the same implementation.

Further, when a particular feature, structure, or characteristic is described in connection with an implementation, such feature, structure, or characteristic may be effected in connection with other implementations whether or not explicitly described.

Dictionary-based compression can be used to improve the efficiency of transmitting feature flag payloads. A shared compression dictionary is a precomputed data structure that stores frequently occurring sequences found in feature flag payloads, allowing for more compact encoding. For dictionary-based compression to be effective, the client device and server must operate on the same version of the dictionary. This requires coordination between the server and the client device to ensure compatibility. If a client device references an outdated or unsupported dictionary version, the server must determine how to respond, which may involve fallback compression techniques or sending uncompressed data. Compression dictionaries can be updated periodically to reflect changes in feature flag payload structure and content.

One or more implementations described herein relate to compressing feature flag payloads using shared compression dictionaries. A server receives a request from a client device for a feature flag payload, where the request includes an indication of a version of a compression dictionary stored on the client device. The server determines whether the version of the compression dictionary is current. If the version is current, the server retrieves a current set of feature flags applicable to the client device based on its platform type, compresses the feature flag payload using the version of the compression dictionary, and transmits the compressed payload to the client device.

In some implementations where the version of the compression dictionary is not current, the server applies an alternative compression technique that does not rely on a shared compression dictionary. Additionally, the server may determine whether the compression dictionary is still available and supported. If the compression dictionary is deprecated, the server may provide a fallback response using a non-dictionary compression technique.

In some implementations, the compression dictionary includes a data structure generated by merging feature flags for multiple platform types. A hash value of the compression dictionary may be computed to uniquely identify the dictionary, and the hash value may be embedded into a client-accessible identifier. This enables the server to verify dictionary versions without requiring external lookups. The compression dictionary may be embedded into a client device application binary, enabling the client device to include the correct dictionary version in its requests.

In some implementations, to enable compatibility with content delivery networks (CDNs) and/or other intermediary proxies, the transmission of feature flag payloads may be performed using a request format that prevents modification by intermediary proxies. A designated request format may be used to direct intermediary proxies, including CDNs, to pass the feature flag payload without additional encoding modifications. Additionally, dictionary negotiation may be performed through a pre-specified uniform resource locator (URL) path, enabling the server to determine whether the version of the compression dictionary is identifiable. If the version is not identifiable at the pre-specified URL path, the client device may be redirected to a fallback endpoint that provides a feature flag payload compressed using an alternative compression technique.

Some technical advantages of one or more described features include a lower bandwidth requirement to transmit feature flag payloads (than traditional compression techniques) by leveraging shared compression dictionaries. Unlike traditional compression techniques that operate on individual payloads in isolation, the described approach applies precomputed dictionaries that capture common patterns across multiple payloads. This enables higher compression ratios, resulting in reduced data transmission sizes and improved time-to-interactivity for client applications.

Another technical advantage of some implementations is improved synchronization between the server and client device regarding dictionary usage. By embedding a hash value or other unique identifier of the compression dictionary into client requests, the server can efficiently verify whether the client device is using a supported dictionary version. This eliminates the need for additional metadata exchanges and ensures that compression remains effective without introducing unnecessary processing overhead.

A further technical advantage of certain implementations is the ability to handle outdated or unsupported dictionary versions gracefully. When a client device requests a feature flag payload using an outdated compression dictionary, the server can detect the issue and seamlessly apply an alternative compression technique. The fallback mechanism ensures that clients can still receive feature flag updates even when dictionary versions become deprecated, preventing service disruptions and maintaining application functionality.

Another technical advantage of some implementations is the ability to generate compression dictionaries in a manner that optimizes storage efficiency and minimizes computational costs. Rather than relying on large historical datasets, the described approach merges the latest feature flag payloads for multiple platform types into a unified structure. This captures redundancies in feature flag payloads, enabling efficient compression without excessive resource consumption.

Yet another technical advantage of the described approach is improved compatibility with content delivery networks (CDNs), caches, and/or intermediary proxies. Traditional HTTP header-based compression negotiation can result in unintended double compression or inconsistencies when CDNs and/or other intermediary proxies modify encoding formats. By using a dedicated request format and ensuring that intermediary proxies pass through the original server-generated compression format, the described approach maintains the integrity of dictionary-based compression and prevents unintended alterations to the transmitted data.

Additionally, some implementations enhance security and reliability by using hash-based dictionary versioning. By computing a unique hash of the compression dictionary and embedding it into client requests, the approach ensures that client devices and servers remain synchronized without requiring external lookup tables or complex versioning mechanisms. This simplifies implementation while maintaining a consistent and predictable compression framework across different client platforms.

System Architecture

FIG. 1 is a diagram of an example system architecture that can be used to compress feature flag payloads using shared compression dictionaries. FIG. 1 and the other figures use like reference numerals to identify similar elements. A letter after a reference numeral, such as "110," indicates that the text refers specifically to the element having that particular reference numeral. A reference numeral in the text without a following letter, such as "110," refers to any or all of the elements in the figures bearing that reference numeral (e.g. "110" in the text refers to reference numerals "110*a*," "110*b*," and/or "110*n*" in the figures).

The system architecture 100 (also referred to as "system" herein) includes online virtual experience server 102, data store 120, client devices 110*a*, 110*b*, and 110*n* (generally referred to as "client device(s) 110" herein), and developer devices 130*a* and 130*n* (generally referred to as "developer device(s) 130" herein). Virtual experience server 102, data store 120, client devices 110, and developer devices 130 are coupled via network 122. In some implementations, client device(s) 110 and developer device(s) 130 may refer to the same or same type of device.

Online virtual experience server 102 can include, among other things, a virtual experience engine 104, one or more virtual experiences 106, and graphics engine 108. In some implementations, the graphics engine 108 may be a system, application, or module that permits the online virtual experience server 102 to provide graphics and animation capability. In some implementations, the graphics engine 108 may perform one or more of the operations described below in connection with the flowchart shown in FIG. 2. In one or more additional or alternative implementations, the operations described below may be performed on one or more client devices 110, or one or more developer devices 130. In some implementations, where the operations are performed depends at least in part on computational resources, e.g., memory, processing power, or disk space. A client device 110 can include a virtual experience application 112, and input/output (I/O) interfaces 114 (e.g., input/output devices). The input/output devices can include one or more of a microphone, speakers, headphones, display device, mouse, keyboard, game controller, touchscreen, virtual reality consoles, etc.

A developer device 130 can include a virtual experience application 132, and input/output (I/O) interfaces 134 (e.g., input/output devices). The input/output devices can include one or more of a microphone, speakers, headphones, display device, mouse, keyboard, game controller, touchscreen, virtual reality consoles, etc.

System architecture 100 is provided for illustration. In different implementations, the system architecture 100 may include the same, fewer, more, or different elements configured in the same or different manner as that shown in FIG. 1.

In some implementations, network 122 may include a public network (e.g., the Internet), a private network (e.g., a local area network (LAN) or wide area network (WAN)), a wired network (e.g., Ethernet network), a wireless network (e.g., an 802.11 network, a Wi-Fi® network, or wireless LAN (WLAN)), a cellular network (e.g., a 5G network, a Long Term Evolution (LTE) network, etc.), routers, hubs, switches, server computers, CDNs such as CDN 136, proxies such as proxy 138, caches, or a combination thereof. CDN 136 may refer to a distributed network of edge servers that cache and deliver content to clients based on geographic proximity to reduce latency. Proxy 138 may refer to an intermediary system that forwards client requests to destination servers while optionally modifying or filtering the requests or responses. In various implementations, caches may store previously requested data, including feature flag payloads, to reduce response times for subsequent requests.

In some implementations, the data store 120 may be a non-transitory computer readable memory (e.g., random access memory), a cache, a drive (e.g., a hard drive), a flash drive, a database system, or another type of component or device capable of storing data. The data store 120 may include multiple storage components (e.g., multiple drives or multiple databases) that may span multiple computing devices (e.g., multiple server computers). In some implementations, data store 120 may include cloud-based storage. In some implementations, data store 120 may include one or more compression dictionaries. In some implementations, the data store may also maintain metadata associated with each compression dictionary, such as, e.g., version identifiers, creation timestamps, supported client platforms, and indicators of whether the compression dictionary is currently valid for use in compressing feature flag payloads.

In some implementations, the online virtual experience server 102 can include a server having one or more computing devices (e.g., a cloud computing system, a rackmount server, a server computer, cluster of physical servers, etc.). In some implementations, the online virtual experience server 102 may be an independent system, may include multiple servers, or be part of another system or server.

In some implementations, the online virtual experience server 102 may include one or more computing devices (such as a rackmount server, a router computer, a server computer, a personal computer, a mainframe computer, a laptop computer, a tablet computer, a desktop computer, etc.), data stores (e.g., hard disks, memories, databases), networks, software components, and/or hardware components that may be used to perform operations on the online virtual experience server 102 and to provide a user with access to online virtual experience server 102. The online virtual experience server 102 may include a website (e.g., a web page) or application back-end software that may be used to provide a user with access to content provided by online virtual experience server 102. For example, users may access online virtual experience server 102 using the virtual experience application 112 on client devices 110.

In some implementations, virtual experience session data are generated via online virtual experience server 102, virtual experience application 112, and/or virtual experience application 132, and are stored in data store 120. With permission from virtual experience participants, virtual experience session data may include associated metadata, e.g., virtual experience identifier(s); device data associated with the participant(s); demographic information of the participant(s); virtual experience session identifier(s); chat transcripts; session start time, session end time, and session duration for each participant; relative locations of participant avatar(s) within a virtual experience environment; purchase(s) within the virtual experience by one or more participants(s); accessories utilized by participants; etc.

In some implementations, online virtual experience server 102 may be a type of social network providing connections between users or a type of user-generated content system that enables users (e.g., end-users or consumers) to communicate with other users on the online virtual experience server 102, where the communication may include voice chat (e.g., synchronous and/or asynchronous voice communication), video chat (e.g., synchronous and/or asynchronous video communication), or text chat (e.g., 1:1 and/or N:N synchronous and/or asynchronous text-based communication). A record of some or all user communications may be stored in data store 120 or within virtual experiences 106. The data store 120 may be utilized to store chat transcripts (text, audio, images, etc.) exchanged between participants.

In some implementations of the disclosure, a "user" may be represented as a single individual. Other implementations of the disclosure include a "user" (e.g., creating user) being an entity controlled by a set of users or an automated source. For example, a set of individual users federated as a community or group in a user-generated content system may be considered a "user."

In some implementations, online virtual experience server 102 may be or include a virtual gaming server. For example, the gaming server may provide single-player or multiplayer games to a community of users that may access a "system" herein that includes online virtual experience server 102, data store 120, and client device 110 and/or may interact with virtual experiences using client devices 110 via network 122. In some implementations, virtual experiences (including virtual realms or worlds, virtual games, other computer-simulated environments) may be 2D virtual experiences, 3D virtual experiences (e.g., 3D user-generated virtual experiences), virtual reality (VR) experiences, or augmented reality (AR) experiences, for example. In some implementations, users may participate in interactions (such as gameplay) with other users. In some implementations, a virtual experience may be experienced in near-real-time with other users of the virtual experience.

In some implementations, virtual experience engagement may refer to the interaction of one or more participants using client devices (e.g., 110) within a virtual experience (e.g., 106) or the presentation of the interaction on a display or other output device (e.g., 114) of a client device 110. For example, virtual experience engagement may include interactions with one or more participants within a virtual experience or the presentation of the interactions on a display of a client device.

In some implementations, a virtual experience 106 can include an electronic file that can be executed or loaded using software, firmware or hardware configured to present the virtual experience content (e.g., digital media item) to an entity. In some implementations, a virtual experience application 112 may be executed and a virtual experience 106 rendered in connection with a virtual experience engine 104. In some implementations, a virtual experience 106 may have a common set of rules or common goal, and the environment of a virtual experience 106 shares the common set of rules or common goal. In some implementations, different virtual experiences may have different rules or goals from one another.

In some implementations, virtual experiences may have one or more environments (also referred to as "virtual experience environments", "virtual environments", or "virtual spaces" herein) where multiple environments may be linked. An example of a virtual environment may be a three-dimensional (3D) environment. The one or more environments of a virtual experience 106 may be collectively referred to as a "world" or "virtual experience world" or "gaming world" or "virtual world" or "virtual space" or "universe" herein. An example of a world may be a 3D world of a virtual experience 106. For example, a user may build a virtual environment that is linked to another virtual environment created by another user. A character (avatar) of the virtual experience may cross the virtual border to enter the adjacent virtual environment.

It may be noted that 3D environments or 3D worlds use graphics that use a three-dimensional representation of geometric data representative of virtual experience content (or at least present virtual experience content to appear as 3D content whether or not 3D representation of geometric data is used). 2D environments or 2D worlds use graphics that use two-dimensional representation of geometric data representative of virtual experience content.

In some implementations, the online virtual experience server 102 can host one or more virtual experiences 106 and can permit users to interact with the virtual experiences 106 using a virtual experience application 112 of client devices 110. Users of the online virtual experience server 102 may play, create, interact with, or build virtual experiences 106, communicate with other users, and/or create and build objects (e.g., also referred to as "item(s)" or "virtual experience objects" or "virtual experience item(s)" herein) of virtual experiences 106.

For example, in generating user-generated virtual items, users may create characters (avatars), decoration for the characters, one or more virtual environments for an interactive virtual experience, or build structures used in a virtual experience 106, among others. In some implementations, users may buy, sell, or trade virtual experience objects, such as in-platform currency (e.g., virtual currency), with other users of the online virtual experience server 102. In some implementations, online virtual experience server 102 may transmit virtual experience content to virtual experience applications (e.g., 112). In some implementations, virtual experience content (also referred to as "content" herein) may refer to any data or software instructions (e.g., virtual experience objects, virtual experience, user information, video, images, commands, media item, etc.) associated with online virtual experience server 102 or virtual experience applications. In some implementations, virtual experience objects (e.g., also referred to as "item(s)" or "objects" or "virtual objects" or "virtual experience item(s)" herein) may refer to objects that are used, created, shared or otherwise depicted in virtual experience applications 106 of the online virtual experience server 102 or virtual experience applications 112 of the client devices 110. For example, virtual experience objects may include a part, model, character, accessories, tools, weapons, clothing, buildings, vehicles, currency, flora, fauna, components of the aforementioned (e.g., windows of a building), and so forth.

It may be noted that the online virtual experience server 102 hosting virtual experiences 106, is provided for purposes of illustration. In some implementations, online virtual experience server 102 may host one or more media items that can include communication messages from one user to one or more other users. With user permission and express user consent, the online virtual experience server 102 may analyze chat transcripts data to improve the virtual experience platform. Media items can include, but are not limited to, digital video, digital movies, digital photos, digital music, audio content, melodies, website content, social media updates, electronic books, electronic magazines, digital newspapers, digital audio books, electronic journals, web blogs, real simple syndication (RSS) feeds, electronic comic books, software applications, etc. In some implementations, a media item may be an electronic file that can be executed or loaded using software, firmware or hardware configured to present the digital media item to an entity.

In some implementations, a virtual experience 106 may be associated with a particular user or a particular group of users (e.g., a private virtual experience), or made widely available to users with access to the online virtual experience server 102 (e.g., a public virtual experience). In some implementations, where online virtual experience server 102 associates one or more virtual experiences 106 with a specific user or group of users, online virtual experience server 102 may associate the specific user(s) with a virtual experience 106 using user account information (e.g., a user account identifier such as username and password).

In some implementations, online virtual experience server 102 or client devices 110 may include a virtual experience engine 104 or virtual experience application 112. In some implementations, virtual experience engine 104 may be used for the development or execution of virtual experiences 106. For example, virtual experience engine 104 may include a rendering engine ("renderer") for 2D, 3D, VR, or AR graphics, a physics engine, a collision detection engine (and collision response), sound engine, scripting functionality, animation engine, artificial intelligence engine, networking functionality, streaming functionality, memory management functionality, threading functionality, scene graph functionality, or video support for cinematics, among other features. The components of the virtual experience engine 104 may generate commands that help compute and render the virtual experience (e.g., rendering commands, collision commands, physics commands, etc.) In some implementations, virtual experience applications 112 of client devices 110, respectively, may work independently, in collaboration with virtual experience engine 104 of online virtual experience server 102, or a combination of both.

In some implementations, both the online virtual experience server 102 and client devices 110 may execute a virtual experience engine (104 and 112, respectively). The online virtual experience server 102 using virtual experience engine 104 may perform some or all the virtual experience engine functions (e.g., generate physics commands, rendering commands, etc.), or offload some or all the virtual experience engine functions to virtual experience engine 104 of client device 110. In some implementations, each virtual experience 106 may have a different ratio between the virtual experience engine functions that are performed on the online virtual experience server 102 and the virtual experience engine functions that are performed on the client devices 110. For example, the virtual experience engine 104 of the online virtual experience server 102 may be used to generate physics commands in cases where there is a collision between at least two virtual experience objects, while the additional virtual experience engine functionality (e.g., generate rendering commands) may be offloaded to the client device 110. In some implementations, the ratio of virtual experience engine functions performed on the online virtual experience server 102 and client device 110 may be changed (e.g., dynamically) based on virtual experience engagement conditions. For example, if the number of users engaging in a particular virtual experience 106 meets a threshold number, the online virtual experience server 102 may perform one or more virtual experience engine functions that were performed by the client devices 110.

For example, users may be playing a virtual experience 106 on client devices 110, and may send control instructions (e.g., user inputs, such as right, left, up, down, user election, or character position and velocity information, etc.) to the online virtual experience server 102. Subsequent to receiving control instructions from the client devices 110, the online virtual experience server 102 may send experience instructions (e.g., position and velocity information of the characters participating in the group experience or commands, such as rendering commands, collision commands, etc.) to the client devices 110 based on control instructions. For instance, the online virtual experience server 102 may perform one or more logical operations (e.g., using virtual experience engine 104) on the control instructions to generate experience instruction(s) for the client devices 110. In other instances, online virtual experience server 102 may pass one or more or the control instructions from one client device 110 to other client devices (e.g., from client device 110*a* to client device 110*b*) participating in the virtual experience 106. The client devices 110 may use the experience instructions and render the virtual experience for presentation on the displays of client devices 110.

In some implementations, the control instructions may refer to instructions that are indicative of actions of a character (i.e., avatar) of the user within the virtual experience. For example, control instructions may include user input to control action within the experience, such as right, left, up, down, user selection, gyroscope position and orientation data, force sensor data, etc. The control instructions may include character position and velocity information. In some implementations, the control instructions are sent directly to the online virtual experience server 102. In other implementations, the control instructions may be sent from a client device 110 to another client device (e.g., from client device 110*b* to client device 110*n*), where the other client device generates experience instructions using the local virtual experience engine 104. The control instructions may include instructions to play a voice communication message or other sounds from another user on an audio device (e.g., speakers, headphones, etc.).

In some implementations, experience instructions may refer to instructions that enable a client device 110 to render a virtual experience, such as a multiparticipant virtual experience. The experience instructions may include one or more of user input (e.g., control instructions), character position and velocity information, or commands (e.g., physics commands, rendering commands, collision commands, etc.).

In some implementations, virtual experience engine 104 or virtual experience application 112 may perform processing and transmission of feature flag payloads as described herein. For example, virtual experience engine 104 may retrieve feature flag configurations that control application behavior or feature availability within a given virtual experience. These configurations may be retrieved in response to user login, session start, or other initialization events. Virtual experience application 112 may prepare a request that includes an indication of the version of a compression dictionary stored on the client device. The server uses this indication to determine whether the version is current and, if so, compresses the applicable feature flag payload accordingly. The compressed payload is then transmitted to the application for decompression and application within the local virtual experience runtime.

In some implementations, characters (or virtual experience objects generally) are constructed from components, one or more of which may be selected by the user, that automatically join together to aid the user in editing.

In some implementations, a character is implemented as a 3D model and includes a surface representation used to draw the character (also known as a skin or mesh) and a hierarchical set of interconnected bones (also known as a skeleton or rig). The rig may be utilized to animate the character and to simulate motion and action by the character. The 3D model may be represented as a data structure, and one or more parameters of the data structure may be modified to change various properties of the character, e.g., dimensions (height, width, girth, etc.); body type; movement style; number/type of body parts; proportion (e.g., shoulder and hip ratio); head size; etc.

One or more characters (also referred to as an "avatar" or "model" herein) may be associated with a user where the user may control the character to enable an interaction of the user with the virtual experience 106.

In some implementations, a character may include components such as body parts (e.g., hair, arms, legs, etc.) and accessories (e.g., t-shirt, glasses, decorative images, tools, etc.). In some implementations, body parts of characters that are customizable include head type, body part types (arms, legs, torso, and hands), face types, hair types, and skin types, among others. In some implementations, the accessories that are customizable include clothing (e.g., shirts, pants, hats, shoes, glasses, etc.), weapons, or other tools.

In some implementations, for some asset types, e.g., shirts, pants, etc. the online virtual experience platform may provide users access to simplified 3D virtual object models that are represented by a mesh of a low polygon count, e.g., between about 20 and about 30 polygons.

In some implementations, the user may control the scale (e.g., height, width, or depth) of a character or the scale of components of a character. In some implementations, the user may control the proportions of a character (e.g., blocky, anatomical, etc.). It may be noted that in some implementations, a character may not include a character virtual experience object (e.g., body parts, etc.) but the user may control the character (without the character virtual experience object) to enable the interaction of the user with the virtual experience (e.g., a puzzle game where there is no rendered character game object, but the user still controls a character to control in-game action).

In some implementations, a component, such as a body part, may be a primitive geometrical shape such as a block, a cylinder, a sphere, etc., or some other primitive shape such as a wedge, a torus, a tube, a channel, etc. In some implementations, a creator module may publish a character of a user for view or use by other users of the online virtual experience server 102. In some implementations, creating, modifying, or customizing characters, other virtual experience objects, virtual experiences 106, or virtual experience environments may be performed by a user using an I/O interface (e.g., developer interface) and with or without scripting (or with or without an application programming interface (API)). It may be noted that for purposes of illustration, characters are described as having a humanoid form. It may further be noted that characters may have any form such as a vehicle, animal, animate or inanimate object, or other creative form.

In some implementations, the online virtual experience server 102 may store characters created by users in the data store 120. In some implementations, the online virtual experience server 102 maintains a character catalog and virtual experience catalog that may be presented to users. In some implementations, the virtual experience catalog includes images of virtual experiences stored on the online virtual experience server 102. In addition, a user may select a character (e.g., a character created by the user or other user) from the character catalog to participate in the chosen virtual experience. The character catalog includes images of characters stored on the online virtual experience server 102. In some implementations, one or more of the characters in the character catalog may have been created or customized by the user. In some implementations, the chosen character may have character settings defining one or more of the components of the character.

In some implementations, a character of a user can include a configuration of components, where the configuration and appearance of components and more generally the appearance of the character may be defined by character settings. In some implementations, the character settings of a character of a user may at least in part be chosen by the user. In other implementations, a user may choose a character with default character settings or character setting chosen by other users. For example, a user may choose a default character from a character catalog that has predefined character settings, and the user may customize the default character by changing some of the character settings (e.g., adding a shirt with a customized logo). The character settings may be associated with a particular character by the online virtual experience server 102.

In some implementations, the client device(s) 110 may each include computing devices such as personal computers (PCs), mobile devices (e.g., laptops, mobile phones, smart phones, tablet computers, or netbook computers), network-connected televisions, gaming consoles, etc. In some implementations, a client device 110 may be referred to as a "user device." In some implementations, one or more client devices 110 may connect to the online virtual experience server 102 at any given moment. It may be noted that the number of client devices 110 is provided as illustration. In some implementations, any number of client devices 110 may be used.

In some implementations, each client device 110 may include an instance of the virtual experience application 112, respectively. In one implementation, the virtual experience application 112 may permit users to use and interact with online virtual experience server 102, such as control a virtual character in a virtual experience hosted by online virtual experience server 102, or view or upload content, such as virtual experiences 106, images, video items, web pages, documents, and so forth. In one example, the virtual experience application may be a web application (e.g., an application that operates in conjunction with a web browser) that can access, retrieve, present, or navigate content (e.g., virtual character in a virtual experience, etc.) served by a web server. In another example, the virtual experience application may be a native application (e.g., a mobile application, app, virtual experience program, or a gaming program) that is installed and executes local to client device 110 and enables users to interact with online virtual experience server 102. The virtual experience application may render, display, or present the content (e.g., a web page, a media viewer) to a user. In an implementation, the virtual experience application may include an embedded media player (e.g., a Flash® or HTML5 player) that is embedded in a web page.

In some implementations, the client device(s) 110 may each include one or more compression dictionaries. The compression dictionaries may be embedded in the client application binary at build time and remain fixed for the lifetime of the installed application version. In some implementations, each compression dictionary is associated with a unique identifier, such as a hash value, which the client includes in requests for feature flag payloads. In some implementations, multiple compression dictionaries may be stored to support compatibility with different payload sources or to allow for staged transitions between versions.

According to aspects of the disclosure, the virtual experience application may be an online virtual experience server application for users to build, create, edit, and upload content to the online virtual experience server 102 as well as interact with online virtual experience server 102 (e.g., engage in virtual experiences 106 hosted by online virtual experience server 102). As such, the virtual experience application may be provided to the client device(s) 110 by the online virtual experience server 102. In another example, the virtual experience application may be an application that is downloaded from a server.

In some implementations, each developer device 130 may include an instance of the virtual experience application 132, respectively. In one implementation, the virtual experience application 132 may permit a developer user(s) to use and interact with online virtual experience server 102, such as control a virtual character in a virtual experience hosted by online virtual experience server 102, or view or upload content, such as virtual experiences 106, images, video items, web pages, documents, and so forth. In one example, the virtual experience application may be a web application (e.g., an application that operates in conjunction with a web browser) that can access, retrieve, present, or navigate content (e.g., virtual character in a virtual experience, etc.) served by a web server. In another example, the virtual experience application may be a native application (e.g., a mobile application, app, virtual experience program, or a gaming program) that is installed and executes local to client device 110 and enables users to interact with online virtual experience server 102. The virtual experience application may render, display, or present the content (e.g., a web page, a media viewer) to a user. In an implementation, the virtual experience application may include an embedded media player (e.g., a Flash® or HTML5 player) that is embedded in a web page.

According to aspects of the disclosure, the virtual experience application 132 may be an online virtual experience server application for users to build, create, edit, and upload content to the online virtual experience server 102 as well as interact with online virtual experience server 102 (e.g., provide and/or engage in virtual experiences 106 hosted by online virtual experience server 102). As such, the virtual experience application may be provided to the client device(s) 110 by the online virtual experience server 102. In another example, the virtual experience application 132 may be an application that is downloaded from a server. Virtual experience application 132 may be configured to interact with online virtual experience server 102 and obtain access to user credentials, user currency, etc. for one or more virtual experiences 106 developed, hosted, or provided by a virtual experience developer.

In some implementations, a user may login to online virtual experience server 102 via the virtual experience application. The user may access a user account by providing user account information (e.g., username and password) where the user account is associated with one or more characters available to participate in one or more virtual experiences 106 of online virtual experience server 102. In some implementations, with appropriate credentials, a virtual experience developer may obtain access to virtual experience virtual objects, such as in-platform currency (e.g., virtual currency), avatars, special powers, accessories, which are owned by or associated with other users.

In general, functions described in one implementation as being performed by the online virtual experience server 102 can be performed by the client device(s) 110, or a server, in other implementations if appropriate. In addition, the functionality attributed to a particular component can be performed by different or multiple components operating together. The online virtual experience server 102 can be accessed as a service provided to other systems or devices through suitable application programming interfaces (hereinafter "APIs"), and thus is not limited to use in websites.

Feature Flag Payload Compression Using Shared Compression Dictionaries

Figure 2:
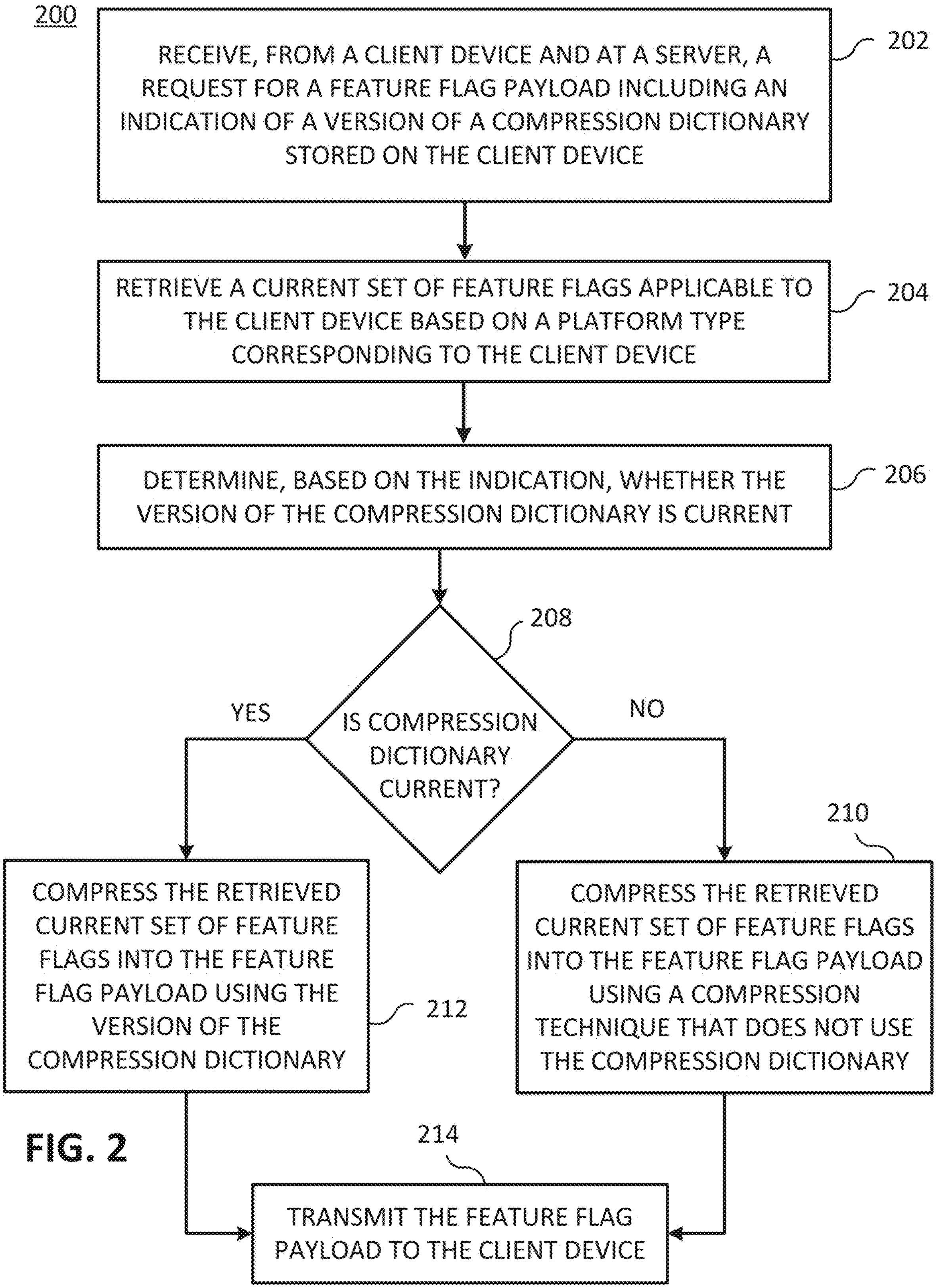
FIG. 2 is a flow diagram illustrating an example method to compress feature flag payloads using shared compression dictionaries, in accordance with some implementations.

FIG. 2 is a flow diagram illustrating an example method 200 to compress feature flag payloads using shared compression dictionaries, in accordance with some implementations. In various implementations, the blocks shown in FIG. 2 and described below may be performed by any of the computing devices illustrated in FIG. 1, e.g., one or more of client devices 110 and/or online virtual experience server 102. For example, two or more client devices 110 may perform method 200, or at least one client device 110 and online virtual experience server 102 may perform method 200. In some implementations, certain blocks of method 200 may be performed by a client device 110 and other blocks of method 200 may be performed by an online virtual experience server 102. Method 200 begins at block 202.

At block 202, a request for a feature flag payload is received at a server, e.g., virtual experience server 102, from a client device, e.g., any of client devices 110*a*-110*n*. The request includes an indication of a version of a compression dictionary stored on the client device. A feature flag payload includes a data structure including values that determine configuration settings for an application executing on a client device. Feature flag payloads may be used to enable, disable, or modify application functionality without requiring a software update to be installed on the client device. A client device is a computing device that executes an application that relies on feature flag payloads for configuration. Examples of client devices include, e.g., mobile phones/smartphones, tablet computers, desktop computers, handheld gaming devices, game consoles, augmented/virtual reality (AR/VR) devices, other wearable devices, embedded systems, television, smart display, and any other type of computing device that a user can use to access a virtual environment and participate in virtual experiences/games. In some implementations, a user may use multiple client devices for participation, e.g., a smartphone that executes a virtual experience application 112 and is coupled to a separate display (e.g., a television, AR/VR device) where the virtual experience is displayed.

In various implementations, a server is a computing system that processes client device requests and provides responses including feature flag payloads. The server may be implemented as a single machine or as part of a distributed computing environment. In some implementations, the server may be implemented as a virtual machine running on a physical server. The server retrieves feature flag values based on preconfigured rules, databases, or external inputs and transmits them to the requesting client device. A server may handle requests from multiple client devices, each operating on different platforms, requiring platform-specific feature flag payloads.

The request sent from the client device includes an indication of a version of a compression dictionary stored on the client device. A compression dictionary includes a predefined data structure that is usable to encode and decode feature flag payloads to reduce data size. The compression dictionary includes a mapping of frequently occurring sequences of data to shorter representations. By referencing a shared compression dictionary, a server can compress a feature flag payload in a manner that enables the client device to decompress it using the same dictionary. The compression dictionary is stored on the client device, meaning it is written to a persistent or temporary storage location accessible to the application requesting feature flag payloads. Examples of storage locations include, e.g., local file systems, in-memory caches, or application-specific databases.

In some implementations, the version of the compression dictionary is a unique identifier that distinguishes one compression dictionary from another. In various implementations, the version may be represented as, for example, a hash value, a numerical identifier, a timestamp, or another unique identifier associated with a particular compression dictionary. The version of the compression dictionary that is available at the client device is included in the request and provides information to the server that identifies the specific dictionary (or dictionaries, if multiple dictionaries are stored on the client device) that is available for decompression.

This enables selection of the indicated compression dictionary (e.g., by looking up the identifier of the available dictionary against a set of dictionaries stored by the server) to encode the feature flag payload before transmission. In some implementations, if the version is absent or unrecognized, the server may apply an alternative compression scheme or return an uncompressed feature flag payload to the client device.

In various implementations, the request may be transmitted using a communication protocol such as, e.g., Hypertext Transfer Protocol (HTTP), Transmission Control Protocol (TCP), or any other suitable data exchange mechanism. In some implementations, the request may be formatted as a structured data payload, such as a JavaScript Object Notation (JSON) or Protocol Buffers (protobuf) object. In some implementations, the request may include additional metadata, such as metadata identifying, for example, the client application, device type, or other parameters that are useful for feature flag determination. The indication of the version of the compression dictionary may be included in the request as a URL parameter, an HTTP header, or within the body of the request payload.

The server receives the request and extracts the version of the compression dictionary from the received data. In some implementations, the server compares the extracted version against a set of supported dictionary versions stored in a database or in memory. In some implementations, the server logs the received request and associated version for monitoring, debugging, or analytics purposes.

In some implementations, the compression dictionary is generated by merging a current set of feature flags for multiple platform types corresponding to different client devices into a data structure. In some implementations, each platform type may be associated with a respective set of feature flags based on differences in application behavior, hardware capabilities, or system configurations. To construct the compression dictionary, in these implementations, the server aggregates feature flag payloads across the platform types, combining shared values while resolving conflicts using predefined rules. The merged data structure captures recurring patterns across platform-specific payloads, enabling the compression dictionary to represent commonly occurring sequences efficiently. This approach enables a single dictionary that is usable across multiple client device types. In some implementations, the merged compression dictionary may be periodically updated based on changes in feature flag configurations.

In some implementations, during merging the current set of feature flags into a key-value data structure, conflicting keys in the data structure are resolved using a predefined preference. The compression dictionary is constructed by aggregating feature flag payloads from multiple platform types, each of which may define feature flags with overlapping keys but differing values. In some implementations, a predefined rule-based system is applied to determine the value that is retained when conflicts arise. In various implementations, the predefined preference may be based on factors such as platform priority, timestamp of the most recent update, or a hierarchical ordering of feature flag sources. For example, if a feature flag for a specific setting exists in both Android™ and iOS payloads but with different values, the predefined preference may dictate that the Android value takes precedence. Alternatively, in some implementations, the most recently modified flag value may be selected to reflect the latest configuration state.

In some implementations, a hash value of the compression dictionary is computed, where the hash value uniquely identifies the compression dictionary. In some implementations, the hash function may be a collision-resistant algorithm, such as, e.g., SHA-256, which generates a fixed-length output based on the contents of the compression dictionary. The resulting hash value serves as a unique identifier for the dictionary, enabling the server and client device to reference the same dictionary version without requiring external lookups or versioning tables. In these implementations, the hash value is embedded into a client-accessible identifier. The client device stores the identifier as part of its application binary or configuration data and appends it to feature flag payload requests, such as by including it in a URL parameter or request header. In some implementations, when the server receives a request, it extracts the hash value and verifies whether the corresponding compression dictionary is available and supported. Block 202 is followed by block 204.

At block 204, a current set of feature flags applicable to the client device is retrieved based on a platform type corresponding to the client device. A feature flag is a configuration value that controls aspects of application functionality, such as, e.g., enabling or disabling features, modifying behavior of the client application, or setting specific operational parameters.

In some implementations, the platform type of the client device is identified. The platform type includes a classification of the client device based on, e.g., its operating system, hardware architecture, or software environment. Examples of platform types include Android, IOS, Windows, macOS, Linux, various game console operating systems or architectures. In some implementations, the platform type may include variations such as, e.g., different operating system versions, device form factors, or application build configurations. The request received from the client device may explicitly specify the platform type, or the server may infer the platform type based on request metadata, such as user-agent strings, application identifiers, or other transmitted attributes.

In some implementations, the server retrieves the current set of feature flags for the identified platform type from a feature flag management system. A feature flag management system is a data storage and retrieval system that maintains feature flag values for different client device configurations. In various implementations, the feature flag management system may be implemented using, e.g., a database, an in-memory key-value store, or a distributed configuration service. The feature flag values may be updated dynamically by developers, system administrators, or automated rollout mechanisms. The server queries the management system to obtain the relevant feature flag values based on the platform type of the client device.

In some implementations, retrieval of the current set of feature flags may include conditional logic to account for user-specific or application-specific configurations. In some implementations, some feature flags may be assigned default values for all clients of a given platform type, while others may be customized based on, e.g., user roles, geographic regions, or rollout groups (e.g., that specify whether a particular client device is part of a feature rollout for the application or is excluded from the feature rollout). In some implementations, the server may apply filters or rules to refine the retrieved feature flag set according to the criteria. In some implementations, if multiple versions of a feature flag payload exist for a platform type, the server selects the most recent version or the version that aligns with the application build on the client device.

In some implementations, the retrieved feature flag values are structured into a payload that conforms to the expected format for transmission to the client device. In various implementations, the payload may be formatted as, e.g., JSON, Protocol Buffers (protobuf), or any other structured data representation. In various implementations, the payload may include metadata such as, e.g., a timestamp, version number, or other identifying information to enable client-side validation and processing.

In some implementations, the feature flag payload is structured as a JSON object where each key represents a feature flag name, and each value is a string encoding the corresponding flag data. The values may represent different types of data, including Boolean values (e.g., “True” or “False”), integers (e.g., “7”), or arbitrary string data (e.g., “foo bar”). While feature flag names may follow a specific naming convention that indicates the data type, such as prefixes denoting Boolean, string, or integer flags, the distinction between flag types is not relevant for the compression. In some implementations, the payload is dynamically generated based on the feature flag configuration applicable to the requesting client device and is compressed before transmission to minimize data size. Block 204 is followed by block 206.

At block 206, a determination is made, based on the indication of the version of the compression dictionary received in the request from the client device, of whether the version of the compression dictionary is current. In some implementations, the indication includes a version identifier, such as, e.g., a hash value or version string, included in the request. In some implementations, the determination includes comparing the version identifier against a reference set of versions stored on the server. A compression dictionary is considered current if the indication of the version is among the versions recognized by the server as valid to compress feature flag payloads at the time of the request. In various implementations, the determination may include, e.g., direct comparison against a list of supported versions, verification against a predefined expiration policy, or lookup in a database that stores active dictionary versions.

In various implementations, the server may store supported compression dictionary versions in various ways, such as, e.g., an indexed database table, an in-memory data structure, or a configuration file that is periodically updated. In some implementations, the determination process may include checking whether the indicated version of the compression dictionary matches any of the entries in the stored reference list.

In some implementations, the determination of whether a compression dictionary version is current may incorporate additional logic beyond direct version matching. For example, the server may maintain policies defining a range of supported versions based on release cycles, backward compatibility rules, or other constraints. In some implementations, a dictionary version may be phased out gradually, enabling some overlap between old and new versions. The server may implement a threshold-based expiration policy where a dictionary version remains current until a predefined time period has elapsed since creation (or last update) of that dictionary version.

In some implementations, the determination may account for server-side compression dictionary rotation schedules. Compression dictionaries may be updated periodically based on feature flag payload changes, improvements in compression efficiency, or maintenance schedules. When a new compression dictionary is introduced, prior versions may be retained for a defined duration before being marked as outdated. The server may track the status of each dictionary version and update the reference list dynamically.

At decision point 208, if the determination indicates that the version of the compression dictionary is not current, i.e., the indicated version is absent, deprecated, or otherwise unrecognized, then the server proceeds to block 210. If the determination indicates that the version of the compression dictionary is current, then the server proceeds to block 212.

At block 210, in response to determining that the version of the compression dictionary is not current, the retrieved current set of feature flags is compressed into the feature flag payload using a compression technique that does not use the compression dictionary. In some implementations, the server applies an alternative compression method, such as, e.g., gzip, which reduces payload size without requiring a predefined dictionary. This approach enables the client device to receive and process feature flag payloads even if its stored dictionary version is outdated or unrecognized by the server. In various implementations, the fallback compression technique may be selected dynamically based on server-side policies, client device capabilities, or network conditions. Block 210 is followed by block 214.

At block 212, in response to determining that the version of the compression dictionary is current, the retrieved current set of feature flags is compressed into the feature flag payload using the version of the compression dictionary. Compression reduces the size of the feature flag payload before transmission. The compression operation encodes the feature flag payload by replacing frequently occurring data patterns with shorter representations based on the contents of the compression dictionary. The compression is performed at the server before transmitting the payload to the client device.

The compression dictionary used for encoding is the version indicated in the request received from the client device. The dictionary includes a predefined mapping of recurring sequences within feature flag payloads to compressed representations. The server applies the dictionary to transform the retrieved feature flag payload into a compressed format. The use of a shared dictionary ensures that the compressed output can be correctly decompressed by the client device, as the client device has the same dictionary stored locally.

In some implementations, the compression may be implemented using a dictionary-based algorithm, such as zstd or another entropy encoding technique that supports external dictionary references. In some implementations, the server may apply block-based compression, where the feature flag payload is processed in segments, or stream-based compression, where the payload is encoded as a continuous data stream. In some implementations, the compression may include multiple passes to achieve optimal encoding, depending on the structure and content of the feature flag payload.

In some implementations, during compression, the server may verify that the feature flag payload conforms to expected constraints, such as maximum allowable size limits or structural integrity requirements. If the compression produces an output exceeding size constraints, the server may apply alternative encoding techniques, such as, e.g., adjusting dictionary parameters, truncating optional metadata, or switching to a fallback compression scheme. The server may compute a checksum or hash value for the compressed payload to support integrity verification at the client device.

In some implementations, the feature flag payload may be formatted as a binary or encoded data structure, depending on the transport mechanism used for transmission. In some implementations, the payload may be embedded within a structured response format, including headers specifying metadata such as the compression dictionary version, encoding type, and payload size. The response format ensures that the client device can correctly identify and decode the compressed payload upon receipt.

In some implementations, a new compression dictionary is generated based on one or more historical feature flag payloads, and the feature flags are compressed into the feature flag payload using the new compression dictionary. Historical feature flag payloads are collected over a predefined time period, capturing variations in feature flag configurations across multiple client requests. The historical payloads are analyzed to identify recurring data patterns, which are incorporated into the new compression dictionary. Once the new compression dictionary is generated, the server applies it to encode feature flag payloads before transmission. In some implementations, the dictionary is used to replace frequently occurring sequences within the feature flag payload with shorter encoded representations. The feature flag payload is transmitted to client devices capable of decoding it using the corresponding dictionary version. In some implementations, metadata identifying the new compression dictionary version is included in the response. Block 212 is followed by block 214.

At block 214, the feature flag payload is transmitted to the client device. The server prepares the payload for delivery using a communication protocol that enables client-server data exchange. The transmission includes packaging the payload into a response format compatible with the request of the client device and ensuring that the payload is correctly routed to the intended recipient. In some implementations, the server may include additional metadata in the response to aid in payload processing, such as, for example, encoding format, compression dictionary version, and integrity verification data.

In various implementations, the transmission may occur over a network using a transport protocol such as Hypertext Transfer Protocol (HTTP), HTTP/2, or another communication mechanism suitable for exchanging structured data. In some implementations, the feature flag payload is embedded in the response body, while relevant metadata may be included in response headers or structured fields within the response payload. In some implementations, the server may set appropriate headers, such as Content-Encoding, Content-Length, or other protocol-specific fields, to indicate the compressed nature of the transmitted data.

In some implementations, the response is delivered over a secure channel, such as Transport Layer Security (TLS), to protect the integrity and confidentiality of the transmitted payload. The server may apply request authentication and authorization mechanisms to ensure that only valid client devices receive feature flag payloads. In cases where the request from the client device to the server was routed through intermediary proxies or content delivery networks (CDNs), the response format is structured to maintain compatibility with such intermediaries while preserving the compression properties of the payload.

In some implementations, the server may implement optimizations to mitigate network congestion, reduce latency, and improve delivery reliability. For example, the server may apply response caching policies to avoid redundant processing for identical feature flag requests within a given timeframe. If the feature flag payload is large, the server may use response chunking or streaming transmission to enable incremental data retrieval by the client device. The server may enforce rate limiting or request throttling policies to address high volumes of simultaneous client requests.

In some implementations, upon receiving the transmitted response, the client device extracts and processes the feature flag payload. The client device identifies the compression dictionary version used for encoding, applies the corresponding decompression technique, and reconstructs the original feature flag payload. In some implementations, if the client device encounters issues such as missing data, corruption, or dictionary mismatches, it may implement error-handling mechanisms, such as requesting a fallback payload or reattempting retrieval.

In some implementations, after the server transmits the feature flag payload, it may log the transaction for monitoring, debugging, or analytics purposes. The server may record details such as request timestamps, client device identifiers, payload sizes, and response times. The data may be used for auditing, performance tuning, or diagnosing transmission-related issues. The server may trigger notifications or updates based on feature flag changes, enabling developers or system administrators to track deployment status across client devices.

In some implementations, a rate of degradation is determined (or predicted) for the compression dictionary, and based on the rate of degradation, a time period is determined for which the compression dictionary is effective. In some implementations, the rate of degradation is determined by analyzing changes in feature flag payloads over time to determine how well the existing compression dictionary continues to reduce payload size. In some implementations, the analysis may include tracking compression ratios for a set of recent feature flag payloads and identifying trends that indicate reduced effectiveness, such as an increase in uncompressed data portions or a decrease in compression efficiency. The server may compute a degradation score based on the metrics and compare it to a predefined threshold. Based on the rate of degradation, a time period is established for when the compression dictionary should be updated. In some implementations, the time period may relate to a rate of flag changes, and is specific to a given payload. For example, in the first few weeks of the time period, the compressed size may increase very rapidly, doubling approximately every 10-11 days. After about two months, the rate may then slow considerably, with a doubling time of approximately 70 days and eventually plateauing.

In some implementations, when a rate of degradation for the compression dictionary is predicted, the system performs a dictionary rotation once the predicted degradation is expected to exceed an acceptable threshold within a defined time horizon. Rotating the dictionary includes generating a new compression dictionary based on recent feature flag payloads, assigning it a new version identifier, and updating server-side components to use the new dictionary for compressing future payloads. The rotation process may be scheduled in advance based on the projected timeline for when the compression efficiency of the current dictionary will fall below the predefined limit, allowing sufficient lead time for deployment coordination, including embedding the new dictionary in updated client device application binaries.

In some implementations, the system may use a degradation threshold to determine when to rotate the compression dictionary. The server monitors the compression efficiency of the dictionary by evaluating compression ratios over a series of recent feature flag payloads. The compression efficiency may be measured as the ratio between the uncompressed and compressed sizes of the payloads when encoded using the current dictionary. An initial compression efficiency is recorded when the dictionary is created, and subsequent measurements are compared against this baseline. When the observed compression efficiency declines by more than a predefined percentage relative to the initial value, indicating that the dictionary is no longer effectively capturing the current structure of the payloads, the server triggers a dictionary rotation. The threshold may be defined in terms of an absolute or relative drop in efficiency, such as a 20% decrease from the original compression ratio. This degradation-based thresholding approach allows for dictionary updates to be performed in response to actual declines in performance, rather than relying on a fixed time interval or an estimation of degradation rate.

In some implementations, prior to compressing the retrieved current set of feature flags into the feature flag payload, the compression dictionary is determined to not be available at the server. In response to this determination, the retrieved current set of feature flags is compressed into the feature flag payload using a compression technique that does not use the compression dictionary. In some implementations, the determination that the dictionary is not available is based on the version indicated in the client request not matching any of the dictionary versions recognized by the server at the time of the request. The server applies a different compression technique that operates independently of any precomputed dictionary, allowing the feature flag payload to be encoded without reference to the unavailable dictionary.

In some implementations, it is determined that the version of the compression dictionary is not available at a pre-specified uniform resource locator (URL) path. The client device includes the version of the compression dictionary in the request URL, enabling the server to verify whether the specified dictionary is available by checking against a designated endpoint. The pre-specified URL path is structured to correspond to a particular dictionary version, enabling the server to determine if the dictionary can be used for compression. If the version is available at the pre-specified URL path, the server processes the request by compressing the feature flag payload using the matching compression dictionary and transmitting the compressed payload to the client device.

Upon determining that the version of the compression dictionary is not available at the pre-specified URL path, the client device is redirected to a fallback endpoint that provides a feature flag payload compressed using a compression technique that does not use the compression dictionary. In some implementations, the fallback endpoint may be a dedicated server endpoint configured to handle requests where dictionary-based compression is not applicable. Instead of using dictionary compression, the fallback endpoint applies an alternative compression technique, such as, e.g., gzip, to encode the feature flag payload.

In some implementations, the compression dictionary is embedded into a binary of a client application, wherein the client application is available for download from the server. The compression dictionary is incorporated into the compiled code or resource files of the application during the build, enabling the client device to have a predefined dictionary version upon installation. This approach eliminates the need for the client device to download a separate dictionary file at runtime and ensures that the correct dictionary version is available for decoding feature flag payloads. The embedded dictionary may be stored in a structured format within the application binary, such as a constant data structure, a bundled asset, or an embedded configuration file. When the client application is installed and executed, the embedded compression dictionary is loaded into memory and used for decompressing feature flag payloads received from the server. The client application includes the dictionary version in requests for feature flag payloads, enabling the server to determine whether the indicated dictionary version is supported for compression. Because the compression dictionary is embedded at build time, the dictionary version remains fixed until a new version of the client application is released. When an updated client application is made available for download from the server, it includes an updated compression dictionary.

In some implementations, transmitting the feature flag payload to the client device includes the feature flag payload being generated using a compression scheme that prevents modification by intermediary proxies along a network path between the client device and the server. Intermediary proxies, such as, e.g., content delivery networks (CDNs), routers, caches, and/or other intermediate network infrastructure, may automatically alter compression formats based on standard HTTP negotiation mechanisms. To prevent unintended modifications, the feature flag payload is encoded using a compression format and sent with a request structure that excludes unsupported encoding modifications. In some implementations, this may include setting a header that specifies only the expected dictionary-based compression while omitting other compression formats that proxies may apply. A request format is utilized to direct the intermediary proxies, including, e.g., CDNs, routers, and caching layers, to pass the feature flag payload from the server to the client device without modification. This may include structuring the request URL or configuring response headers to ensure that the payload is transmitted as-is. In some implementations, caching directives are configured to control how intermediate network infrastructures handle dictionary-compressed payloads.

In some implementations, an alternative dictionary-building approach is utilized that includes a training pipeline that utilizes historical feature flag payloads and a dictionary builder tool to generate compression dictionaries. The approach relies on processing large volumes of historical data to construct dictionaries optimized to compress feature flag payloads. The training pipeline includes extracting historical feature flag payloads from an online database that maintains an audit log of feature flag configurations sent to various client device types over time. A data extraction tool is used to create a snapshot of the database and store the extracted data in a storage system for offline analysis.

Once the historical data is extracted, the training pipeline reconstructs complete feature flag payloads for each client device type across multiple historical days. The reconstruction includes assembling feature flag values as they were sent to clients at specific points in time, ensuring that the training dataset accurately reflects real-world payload distributions. The reconstructed payloads serve as input for the dictionary training, capturing variations in feature flag configurations across different platform types and deployment periods.

To ensure that the dictionary builder tool has a sufficient volume of training data, the training pipeline expands the dataset by splitting historical feature flag payloads into smaller segments at predefined byte boundaries. The segments are duplicated to further increase the training dataset size.

The dictionary builder tool processes the expanded dataset using predefined compression parameters to generate a new compression dictionary. The tool analyzes recurring data sequences across the training dataset and assigns shorter representations to frequently occurring patterns. The resulting dictionary is stored in a designated location and versioned for compatibility with client devices.

Once generated, the dictionary is used by the server to compress feature flag payloads for client devices that indicate support for the corresponding dictionary version in their requests. In some implementations, the training pipeline is executed periodically to update the dictionary based on newer feature flag payloads. The dictionary-building approach leverages historical feature flag data to construct dictionaries utilized to compress feature flag payloads across multiple client device types.

Several technical advantages are provided by the use of shared compression dictionaries for delivering feature flag payloads. Payload size is reduced relative to general-purpose compression techniques, due to the use of dictionaries constructed from actual feature flag payloads that capture recurring sequences. Higher compression ratios are achieved, leading to reduced bandwidth usage and improved application startup performance. As a result, time-to-interactivity is shortened, particularly in environments with constrained network conditions or high latency.

Compatibility across a wide range of client device types is supported without requiring separately compressed payloads to be stored for each platform. A single compression dictionary may be embedded into client binaries and reused across devices associated with the same platform type. Because the compression dictionary version is explicitly indicated in the request, an appropriate compression technique can be applied without relying on header-based content negotiation. This allows reliable transmission even when intermediary entities such as CDNs, caches, or proxies are present in the communication path.

Compression dictionaries may be periodically updated based on recent feature flag payloads, enabling adaptation to changes in payload structure without requiring modifications to the application binary. In this way, new configuration states can be delivered while maintaining compatibility with existing deployed clients. These techniques reduce operational complexity, support efficient payload distribution, and enable dynamic feature management across client environments.

In some implementations, one or more of blocks 202-210 may be performed by one or more server devices, and one or more of blocks 202-210 may be performed by one or more client devices. In some implementations, all of method 200 may be performed by a server device, or by a client device.

Feature Flag Payload Example

FIG. 3A is a screenshot illustrating an example 300 of an excerpt from a feature flag payload, in accordance with some embodiments. The feature flag payload is represented as an JSON object including a set of key-value pairs. Each key is a string corresponding to a feature flag name, and each associated value is a string-encoded representation of the flag's value. As shown in the figure, values may include Boolean values such as "True" or "False", integers represented as strings such as "5000" or "3145728", and other string-based entries.

The feature flag names follow a naming convention that conveys certain metadata, such as intended usage or data type. For example, flag names prefixed with "DFFlag" correspond to Boolean flags, "DFInt" to integer flags, and "DFString" to string flags.

Compression Dictionary Example

FIG. 3B is a screenshot illustrating an example 350 of an excerpt from a compression dictionary created by merging payloads, in accordance with some embodiments. The compression dictionary is represented as a JSON object composed of key-value pairs, where each key corresponds to a feature flag name and each value is a string-encoded representation of the feature flag's setting. The values include Booleans such as "True" and "False", integers represented as strings (e.g., "3145728", "5000"), and other string-formatted entries. The format of the compression dictionary mirrors the format of a feature flag payload, particularly the example feature flag payload illustrated in FIG. 3A, as the compression dictionary is constructed by merging multiple real-world payloads into a single structure.

The example compression dictionary is generated using a merging-based approach, where feature flag payloads from multiple platform types are combined into one representative data structure. The resulting merged JSON object captures frequently occurring key-value sequences across platforms, which are then used as the basis for dictionary-based compression.

Computing Device

Figure 4:
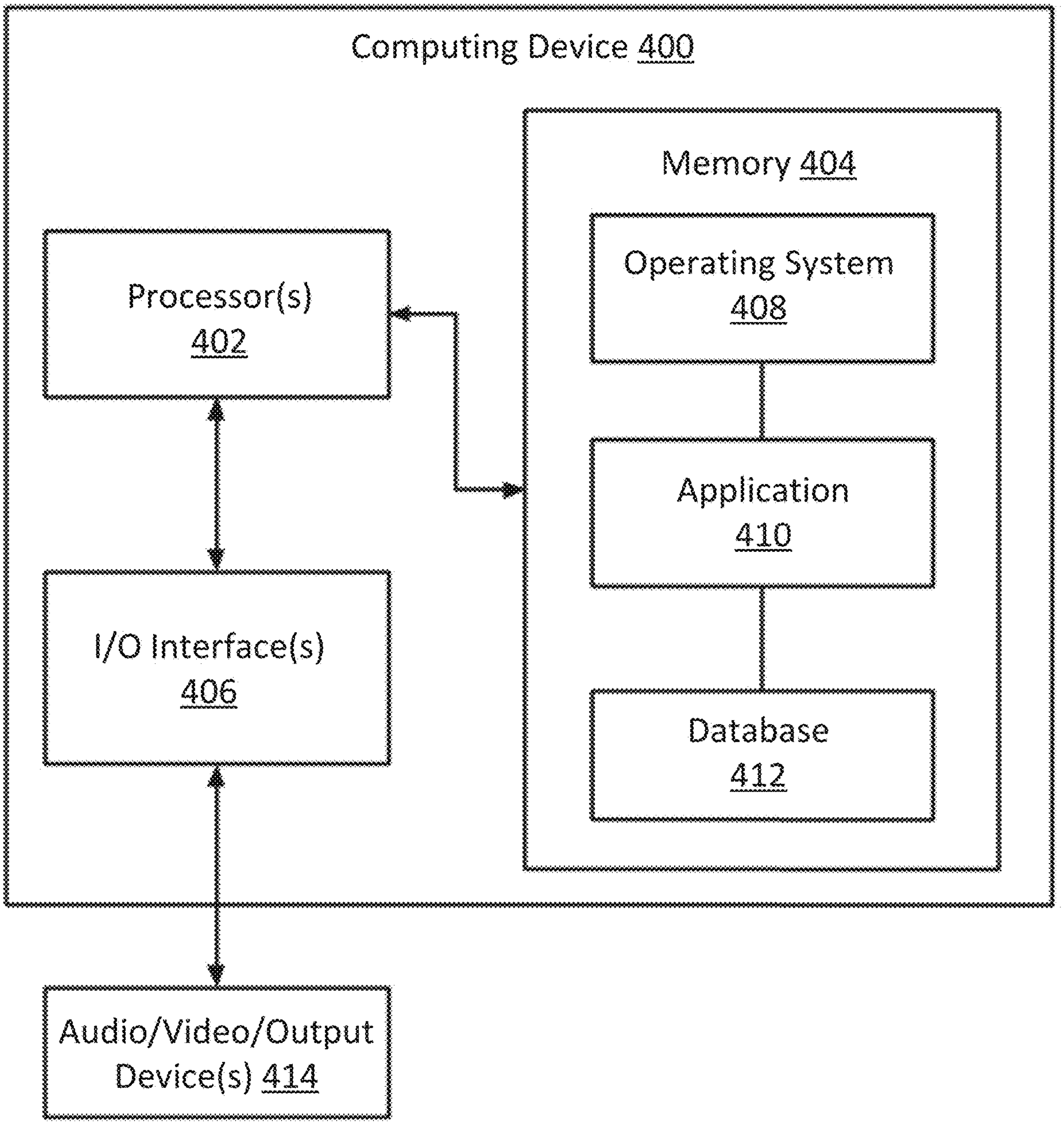
FIG. 4 is a block diagram that illustrates an example computing device, in accordance with some implementations.

FIG. 4 is a block diagram of an example computing device 400 which may be used to implement one or more techniques described herein, including one or more techniques described with reference to FIG. 2. In one example, device 400 may be used to implement a computer device (e.g., 102 and/or 110 of FIG. 1), and perform appropriate method implementations described herein. Computing device 400 can be any suitable computer system, server, or other electronic or hardware device. For example, the computing device 400 can be a mainframe computer, desktop computer, workstation, portable computer, or electronic device (portable device, mobile device, cell phone, smartphone, tablet computer, television, TV set top box, personal digital assistant (PDA), media player, game device, wearable device, etc.). In some implementations, device 400 includes a processor 402, a memory 404, input/output (I/O) interface 406, and audio/video input/output devices 414.

Processor 402 can be one or more processors and/or processing circuits to execute program code and control basic operations of the device 400. A "processor" includes any suitable hardware and/or software system, mechanism or component that processes data, signals or other information. A processor may include a system with a general-purpose central processing unit (CPU), multiple processing units, dedicated circuitry for achieving functionality, or other systems. Processing need not be limited to a particular geographic location, or have temporal limitations. For example, a processor may perform its functions in "real-time," "near-real-time", "offline," in a "batch mode," etc. Portions of processing may be performed at different times and at different locations, by different (or the same) processing systems. A computer may be any processor in communication with a memory.

Memory 404 is provided in device 400 for access by the processor 402, and may be any suitable computer-readable or processor-readable storage medium, e.g., random access memory (RAM), read-only memory (ROM), Electrically Erasable Read-only Memory (EEPROM), Flash memory, etc., suitable for storing instructions for execution by the processor, and located separate from processor 402 and/or integrated therewith. Memory 404 can store software operating on the server device 400 by the processor 402, including an operating system 408, one or more applications 410, and a database 412 that may store data used by the components of device 400.

Database 412 may store one or more mechanisms, including compression dictionaries used for encoding feature flag payloads transmitted to client devices. In some implementations, database 412 may store multiple versions of compression dictionaries, each associated with different platform types or application releases. The stored dictionaries may be referenced by server processes to determine whether a requested dictionary version is current and to apply the compression technique. The database may maintain metadata related to dictionary versions, such as hash values, creation timestamps, and degradation metrics used to determine when dictionary rotation is necessary. In some implementations, database 412 may store additional data relevant to feature flag payload processing, including historical audit logs of feature flag configurations, caching policies for different client platforms, and parameters used for compression fallback mechanisms. Applications 410 may include instructions that enable processor 402 to execute the described techniques, such as retrieving feature flag payloads, determining dictionary compatibility, applying compression using a shared dictionary, and handling requests for non-dictionary-compressed payloads when necessary.

For example, applications 410 can include a module that implements one or more compression and dictionary management techniques described herein, such as determining dictionary compatibility, applying dictionary-based compression, or handling fallback compression methods. Applications 410 can integrate mechanisms that determine dictionary version compatibility by extracting hash values or version identifiers from client requests, triggering fallback compression when a requested dictionary is not supported, or selecting compression parameters based on predicted dictionary degradation. The applications can employ one or more approaches for dictionary training, including generating dictionaries from historical feature flag payloads, merging payloads across multiple platform types, or using predefined data structures to construct shared compression dictionaries. Database 412 (and/or other connected storage) can store various data used in the described techniques, including historical feature flag payloads, compression dictionary versions, hash identifiers, fallback compression configurations, and parameters used to determine when a dictionary should be rotated or updated.

Elements of software in memory 404 can alternatively be stored on any other suitable storage location or computer-readable medium. In addition, memory 404 (and/or other connected storage device(s)) can store instructions and data used in the features described herein. Memory 404 and any other type of storage (magnetic disk, optical disk, magnetic tape, or other tangible media) can be considered "storage" or "storage devices."

I/O interface 406 can provide functions to enable interfacing the server device 400 with other systems and devices. For example, network communication devices, storage devices (e.g., memory and/or data store 120), and input/output devices can communicate via interface 406. In some implementations, the I/O interface can connect to interface devices including input devices (keyboard, pointing device, touchscreen, microphone, camera, scanner, etc.) and/or output devices (display device, speaker devices, printer, motor, etc.).

The audio/video input/output devices 414 can include a variety of devices including a user input device (e.g., a mouse, etc.) that can be used to receive user input, audio output devices (e.g., speakers), and a display device (e.g., screen, monitor, etc.) and/or a combined input and display device, which can be used to provide graphical and/or visual output.

For ease of illustration, FIG. 4 shows one block for each of processor 402, memory 404, I/O interface 406, and software blocks of operating system 408 and virtual experience application 410. The blocks may represent one or more processors or processing circuitries, operating systems, memories, I/O interfaces, applications, and/or software engines. In other implementations, device 400 may not have all of the components shown and/or may have other elements including other types of elements instead of, or in addition to, those shown herein. While the online virtual experience server 102 is described as performing operations as described in some implementations herein, any suitable component or combination of components of online virtual experience server 102, client device 110, or similar system, or any suitable processor or processors associated with such a system, may perform the operations described.

Device 400 can be a server device or client device. Example client devices or user devices can be computer devices including some similar components as the device 400, e.g., processor(s) 402, memory 404, and I/O interface 406. An operating system, software and applications suitable for the client device can be provided in memory and used by the processor. The I/O interface for a client device can be connected to network communication devices, as well as to input and output devices, e.g., a microphone for capturing sound, a camera for capturing images or video, a mouse for capturing user input, a gesture device for recognizing a user gesture, a touchscreen to detect user input, audio speaker devices for outputting sound, a display device for outputting images or video, or other output devices. A display device within the audio/video input/output devices 414, for example, can be connected to (or included in) the device 400 to display images pre- and post-processing as described herein, where such display device can include any suitable display device, e.g., an LCD, LED, or plasma display screen, CRT, television, monitor, touchscreen, 3-D display screen, projector, or other visual display device. Some implementations can provide an audio output device, e.g., voice output or synthesis that speaks text.

One or more methods described herein (e.g., method 200 and other described techniques) can be implemented by computer program instructions or code, which can be executed on a computer. For example, the code can be implemented by one or more digital processors (e.g., microprocessors or other processing circuitry), and can be stored on a computer program product including a non-transitory computer readable medium (e.g., storage medium), e.g., a magnetic, optical, electromagnetic, or semiconductor storage medium, including semiconductor or solid state memory, magnetic tape, a removable computer diskette, a random access memory (RAM), a read-only memory (ROM), flash memory, a rigid magnetic disk, an optical disk, a solid-state memory drive, etc. The program instructions can be contained in, and provided as, an electronic signal, for example in the form of software as a service (SaaS) delivered from a server (e.g., a distributed system and/or a cloud computing system). Alternatively, one or more methods can be implemented in hardware (logic gates, etc.), or in a combination of hardware and software. Example hardware can be programmable processors (e.g., Field-Programmable Gate Array (FPGA), Complex Programmable Logic Device), general purpose processors, graphics processors, Application Specific Integrated Circuits (ASICs), and the like. One or more methods can be performed as part of or component of an application running on the system, or as an application or software running in conjunction with other applications and operating systems.

One or more methods described herein can be run in a standalone program that can be run on any type of computing device, a program run on a web browser, a mobile application ("app") run on a mobile computing device (e.g., cell phone, smart phone, tablet computer, wearable device (wristwatch, armband, jewelry, headwear, goggles, glasses, etc.), laptop computer, etc.). In one example, a client/server architecture can be used, e.g., a mobile computing device (as a client device) sends user input data to a server device and receives from the server the final output data for output (e.g., for display). In another example, all computations can be performed within the mobile app (and/or other apps) on the mobile computing device. In another example, computations can be split between the mobile computing device and one or more server devices.

Although the description has been described with respect to particular implementations thereof, the particular implementations are merely illustrative, and not restrictive. Concepts illustrated in the examples may be applied to other examples and implementations.

The functional blocks, operations, features, methods, devices, and systems described in the present disclosure may be integrated or divided into different combinations of systems, devices, and functional blocks as would be known to those skilled in the art. Any suitable programming language and programming techniques may be used to implement the routines of particular implementations. Different programming techniques may be employed, e.g., procedural or object-oriented. The routines may execute on a single processing device or multiple processors. Although the steps, blocks, operations, or computations may be presented in a specific order, the order may be changed in different particular implementations. In some implementations, multiple steps or operations shown as sequential in the specification may be performed at the same time.

The invention claimed is:

1. A computer-implemented method comprising:

receiving, from a client device and at a server, a request for a feature flag payload, the request comprising an indication of a version of a compression dictionary stored on the client device;

retrieving a current set of feature flags applicable to the client device based on a platform type corresponding to the client device;

determining whether the version of the compression dictionary indicated in the request remains effective for compressing the retrieved current set of feature flags based on a structure of the retrieved current set of feature flags;

in response to determining that the version of the compression dictionary remains effective, compressing the retrieved current set of feature flags into the feature flag payload using the version of the compression dictionary; and transmitting the feature flag payload to the client device.

2. The computer-implemented method of claim 1, further comprising, in response to determining that the version of the compression dictionary does not remain effective, compressing the retrieved current set of feature flags into the feature flag payload using a compression technique that does not use the compression dictionary.

3. The computer-implemented method of claim 1, wherein the compression dictionary comprises a data structure generated by merging a current set of feature flags for multiple platform types.

4. The computer-implemented method of claim 1, further comprising:

computing a hash value of the compression dictionary, wherein the hash value uniquely identifies the compression dictionary; and embedding the hash value into a client-accessible identifier.

5. The computer-implemented method of claim 1, further comprising:

prior to compressing the retrieved current set of feature flags into the feature flag payload, determining that the compression dictionary is not available at the server; and in response to determining that the compression dictionary is not available, compressing the retrieved current set of feature flags into the feature flag payload using a compression technique that does not use the compression dictionary.

6. The computer-implemented method of claim 1, further comprising:

predicting a rate of degradation for the compression dictionary;

based on the rate of degradation, determining a time period for which the compression dictionary is effective; and performing a dictionary rotation after the time period.

7. The computer-implemented method of claim 1, further comprising:

determining that the version of the compression dictionary is not available at a pre-specified uniform resource locator (URL) path; and upon a determination that the version of the compression dictionary is not available at the pre-specified URL path, redirecting the client device to a fallback endpoint that provides a feature flag payload compressed using a compression technique that does not use the compression dictionary.

8. The computer-implemented method of claim 1, further comprising:

embedding the compression dictionary into a binary of a client application, wherein the client application is available for download from the server.

9. The computer-implemented method of claim 1, wherein transmitting the feature flag payload to the client device comprises:

generating the feature flag payload using a compression scheme that prevents modification by intermediary proxies along a network path between the client device and the server; and sending the feature flag payload using a request format that specifies the version of the compression dictionary and restricts unsupported encoding modification, wherein the request format directs the intermediary proxies to pass the feature flag payload from the server to the client device without modification.

10. A computing device comprising:

one or more processors; and memory coupled to the one or more processors with instructions stored thereon that, when executed by the one or more processors, cause the one or more processors to perform operations comprising:

receiving, from a client device and at a server, a request for a feature flag payload, the request comprising an indication of a version of a compression dictionary stored on the client device;

retrieving a current set of feature flags applicable to the client device based on a platform type corresponding to the client device;

determining whether the version of the compression dictionary indicated in the request remains effective for compressing the retrieved current set of feature flags based on a structure of the retrieved current set of feature flags;

in response to determining that the version of the compression dictionary is current remains effective, compressing the retrieved current set of feature flags into the feature flag payload using the version of the compression dictionary; and transmitting the feature flag payload to the client device.

11. The computing device of claim 10, wherein the operations further comprise, in response to determining that the version of the compression dictionary does not remain effective, compressing the retrieved current set of feature flags into the feature flag payload using a compression technique that does not use the compression dictionary.

12. The computing device of claim 10, wherein the compression dictionary comprises a data structure generated by merging a current set of feature flags for multiple platform types.

13. The computing device of claim 10, wherein the operations further comprise:

computing a hash value of the compression dictionary, wherein the hash value uniquely identifies the compression dictionary; and embedding the hash value into a client-accessible identifier.

14. The computing device of claim 10, wherein the operations further comprise:

prior to compressing the retrieved current set of feature flags into the feature flag payload, determining that the compression dictionary is not available at the server; and in response to determining that the compression dictionary is not available, compressing the retrieved current set of feature flags into the feature flag payload using a compression technique that does not use the compression dictionary.

15. The computing device of claim 10, wherein the operations further comprise:

predicting a rate of degradation for the compression dictionary;

based on the rate of degradation, determining a time period for which the compression dictionary is effective; and performing a dictionary rotation after the time period.

16. A non-transitory computer-readable medium with instructions stored thereon that, when executed by a processor, cause the processor to perform operations comprising:

receiving, from a client device and at a server, a request for a feature flag payload, the request comprising an indication of a version of a compression dictionary stored on the client device;

retrieving a current set of feature flags applicable to the client device based on a platform type corresponding to the client device;

determining whether the version of the compression dictionary indicated in the request remains effective for compressing the retrieved current set of feature flags based on a structure of the retrieved current set of feature flags;

in response to determining that the version of the compression dictionary remains effective, compressing the retrieved current set of feature flags into the feature flag payload using the version of the compression dictionary; and transmitting the feature flag payload to the client device.

17. The non-transitory computer-readable medium of claim 16, wherein the operations further comprise, in response to determining that the version of the compression dictionary does not remain effective, compressing the retrieved current set of feature flags into the feature flag payload using a compression technique that does not use the compression dictionary.

18. The non-transitory computer-readable medium of claim 16, wherein the compression dictionary comprises a data structure generated by merging a current set of feature flags for multiple platform types.

19. The non-transitory computer-readable medium of claim 16, wherein the operations further comprise:

computing a hash value of the compression dictionary, wherein the hash value uniquely identifies the compression dictionary; and embedding the hash value into a client-accessible identifier.

20. The non-transitory computer-readable medium of claim 16, wherein the operations further comprise:

prior to compressing the retrieved current set of feature flags into the feature flag payload, determining that the compression dictionary is not available at the server; and in response to determining that the compression dictionary is not available, compressing the retrieved current set of feature flags into the feature flag payload using a compression technique that does not use the compression dictionary.

* * * * *